United States Patent
Baek et al.

(10) Patent No.: US 9,519,181 B2
(45) Date of Patent: Dec. 13, 2016

(54) DISPLAY SUBSTRATE AND LIQUID CRYSTAL DISPLAY DEVICE HAVING THE SAME

(71) Applicant: Samsung Display Co., LTD., Yongin, Gyeonggi-Do (KR)

(72) Inventors: Seung-Soo Baek, Hwaseong-si (KR); Ki-Won Park, Asan-si (KR); Jae-Jin Song, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/664,436

(22) Filed: Mar. 20, 2015

(65) Prior Publication Data

US 2015/0277200 A1 Oct. 1, 2015

(30) Foreign Application Priority Data

Mar. 31, 2014 (KR) .......................... 10-2014-0038062

(51) Int. Cl.
| | | |
|---|---|---|
| *G02F 1/136* | (2006.01) | |
| *G02F 1/1335* | (2006.01) | |
| *G02F 1/1345* | (2006.01) | |
| *G02F 1/1339* | (2006.01) | |
| *G02F 1/1362* | (2006.01) | |
| *H01L 29/786* | (2006.01) | |

(52) U.S. Cl.
CPC ....... *G02F 1/133512* (2013.01); *G02F 1/1345* (2013.01); *G02F 1/13394* (2013.01); *G02F 1/133514* (2013.01); *G02F 2001/13398* (2013.01); *G02F 2001/136222* (2013.01); *H01L 29/78633* (2013.01)

(58) Field of Classification Search
None
See application file for complete search history.

(56) References Cited

U.S. PATENT DOCUMENTS 8,049,853 B2 11/2011 Park

FOREIGN PATENT DOCUMENTS

| | | |
|---|---|---|
| JP | 07-281197 B2 | 10/1995 |
| JP | 07-311378 A | 11/1995 |
| JP | 08-201620 A | 8/1996 |
| KR | 10-2004-0090116 A | 10/2004 |
| KR | 10-2010-0129027 A | 12/2010 |
| KR | 10-2011-0067261 A | 6/2011 |

*Primary Examiner* — Richard Kim
(74) *Attorney, Agent, or Firm* — Innovation Counsel LLP

(57) ABSTRACT

A display substrate includes a thin film transistor array disposed in a display area, a signal line disposed in a peripheral area surrounding the display area, a contact electrode disposed on the signal line and contacting the signal line, a light-blocking pattern overlapping a first portion of the contact electrode, and a color pattern overlapping a second portion of the contact electrode.

20 Claims, 6 Drawing Sheets

DISPLAY SUBSTRATE AND LIQUID CRYSTAL DISPLAY DEVICE HAVING THE SAME

PRIORITY STATEMENT

This application claims priority under 35 U.S.C. §119 to Korean Patent Application No. 10-2014-0038062, filed on Mar. 31, 2014, and all the benefits accruing therefrom, the content of which is herein incorporated by reference in its entirety.

BACKGROUND

1. Field

Exemplary embodiments relate generally to flat panel displays. More particularly, exemplary embodiments relate to a flat panel display capable of improving display quality, and a liquid crystal display device having the display.

2. Description of the Related Art

Generally, a liquid crystal display device includes a display substrate including a thin film transistor array, and an opposing substrate including a common electrode. The display substrate includes a display area and a peripheral area surrounding the display area. The display substrate is combined with the opposing substrate by a sealing member, and a liquid crystal layer is interposed in the space between the display substrate and the opposing substrate.

The display substrate may further include a signal line providing a common voltage, and a contact electrode contacting the signal line to provide the common voltage to the common electrode. A connection member may be disposed between the display substrate and the opposing substrate to electrically connect the common electrode to the contact electrode.

The signal line may include a metal. For example, the signal line may be formed from a gate metal layer or a source metal layer. The signal line may be reflective, and reflection of external light may deteriorate display quality. Furthermore, the contact electrode may include a transparent conductive material, which transmits light from a backlight thereby also deteriorating display quality.

SUMMARY

Exemplary embodiments provide a display substrate capable of improving display quality in a peripheral area.

Exemplary embodiments also provide a liquid crystal display device including the display substrate.

According to an exemplary embodiment, a display substrate includes a thin film transistor array disposed in a display area, a signal line disposed in a peripheral area surrounding the display area, a contact electrode disposed on the signal line and contacting the signal line, a light-blocking pattern overlapping a first portion of the contact electrode, and a color filter pattern overlapping a second portion of the contact electrode.

In an embodiment, the light-blocking pattern is disposed on the first overlapping portion of the contact electrode.

In an embodiment, the second portion of the contact electrode is disposed on the color filter pattern.

In an embodiment, the display substrate further includes a protection layer disposed on the signal line and including an opening overlapping the contact electrode.

In an embodiment, the opening overlaps the light-blocking pattern.

In an embodiment, wherein the light-blocking pattern substantially surrounds the color filter pattern in a plan view.

In an embodiment, the color filter pattern substantially surrounds the light-blocking pattern in a plan view.

In an embodiment, the color filter pattern and the first overlapping portion are arranged in alternating manner along a direction.

In an embodiment, the color filter pattern and the first portion extend in a first direction, and the color filter pattern and the first overlapping portion are arranged in alternating manner along a second direction perpendicular to the first direction.

In an embodiment, the color filter pattern has a blue color.

In an embodiment, the light-blocking pattern has a black color.

According to an exemplary embodiment, a liquid crystal display device includes a display substrate including a thin film transistor array disposed in a display area, an opposing substrate including a common electrode facing the display substrate, a liquid crystal layer interposed between the display substrate and the opposing substrate, and a sealing member surrounding the liquid crystal layer and coupling the display substrate to the opposing substrate. The display substrate further includes a signal line disposed in a peripheral area surrounding the display area, a contact electrode disposed on and contacting the signal line, a light-blocking pattern overlapping a first portion of the contact electrode, and a color pattern overlapping a second portion of the contact electrode.

According to the exemplary embodiments, connection failure of a conductive spacer, which may be caused by height difference or variation in an area where a sealing member is disposed, may be improved.

Furthermore, light leakage, which may be caused by a bent substrate in an area adjacent to the sealing member, may be prevented or reduced thereby improving display quality of a liquid crystal display device.

Furthermore, a light from below and an external light reflected by a signal line may be reduced, so that display quality in a peripheral area is improved.

BRIEF DESCRIPTION OF THE DRAWINGS

The above and other features and advantages will become more apparent by describing exemplary embodiments thereof with reference to the accompanying drawings, in which.

The various figures are not to scale.

DETAILED DESCRIPTION

Exemplary embodiments will be described more fully hereinafter with reference to the accompanying drawings, in which various embodiments are shown.

Figure 1:
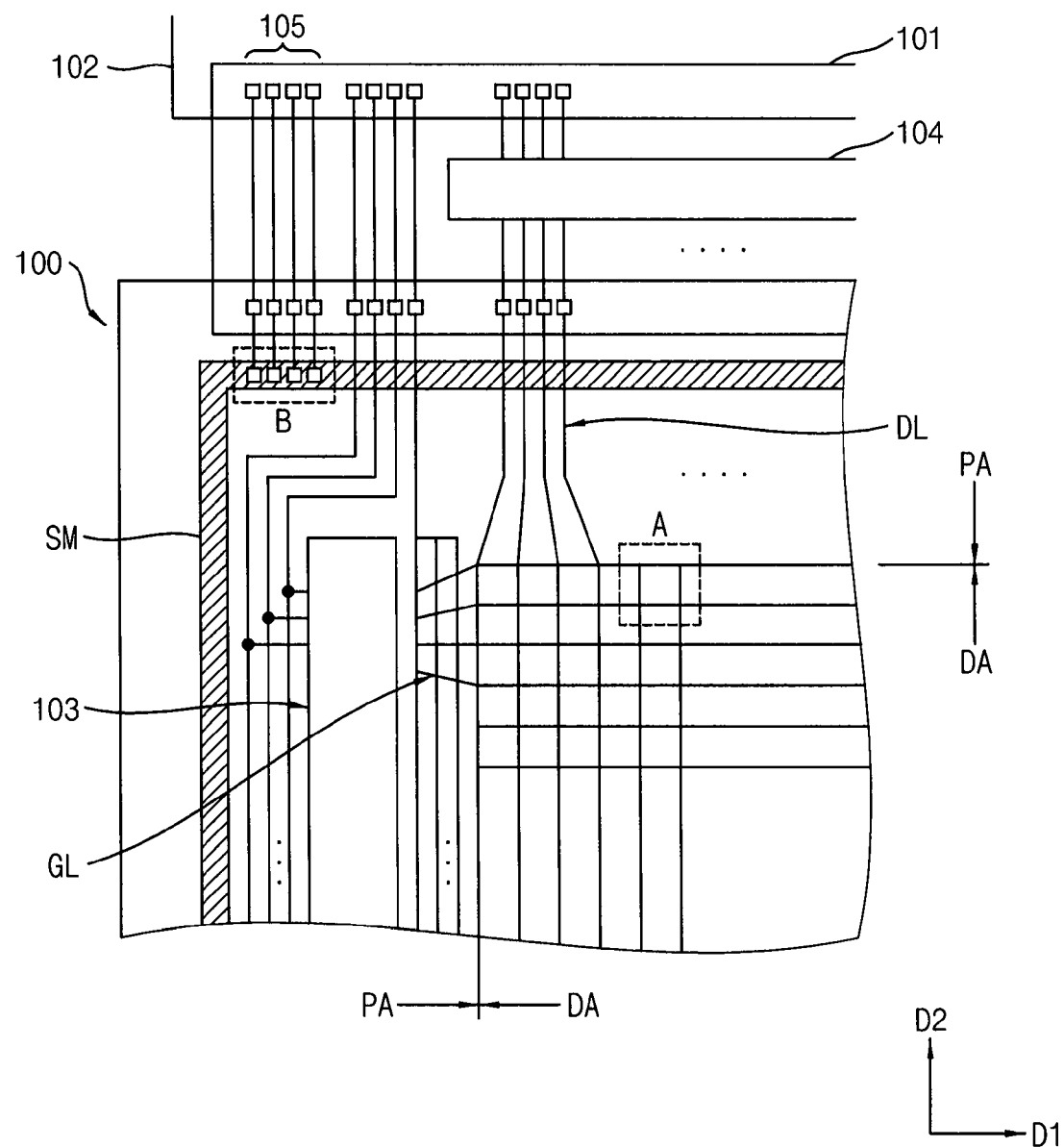
FIG. 1 is a plan view illustrating a liquid crystal display device according to an exemplary embodiment.

FIG. 1 is a plan view illustrating a liquid crystal display device according to an exemplary embodiment. Referring to FIG. 1, a liquid crystal display device includes a display substrate 100, a flexible circuit board 101 connected to the display substrate 100, and a driving circuit board 102 connected to the flexible circuit board 101. The liquid crystal display device further includes an opposing substrate 107 facing the display substrate 100. The opposing substrate 107 includes a common electrode CE. A liquid crystal layer LC is interposed between the display substrate 100 and the opposing substrate 107.

The display substrate 100 includes a gate driver 103. The flexible circuit board 101 includes a data driver 104. The gate driver 103 is formed, along with a thin film transistor array, in a display area of the display substrate 100 in the same process so as to be integrated together on the display substrate 100. Alternatively, the gate driver 103 may be mounted on a chip, and be electrically connected to the display substrate 100 through a printed circuit board.

The display substrate 100 includes a common voltage supply line 105. The common voltage supply line 105 receives a common voltage from the driving circuit board 102 through the flexible circuit board 101. The common voltage is provided to the common electrode CE from the common voltage supply line 105.

Figure 2:
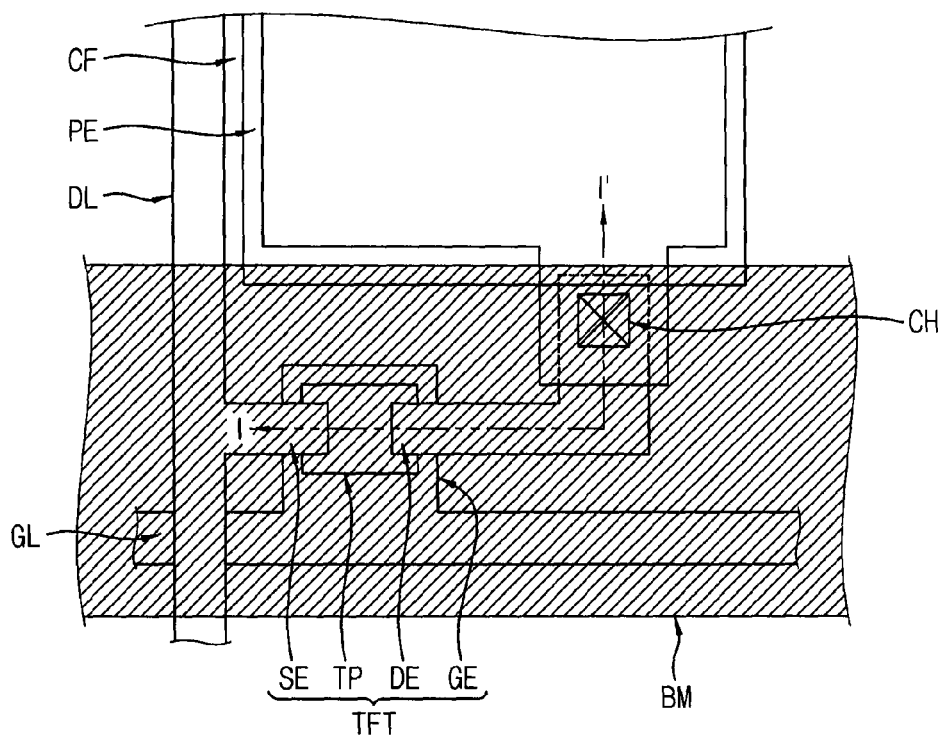
FIG. 2 is an enlarged plan view illustrating region 'A' of FIG. 1.
Figure 3:
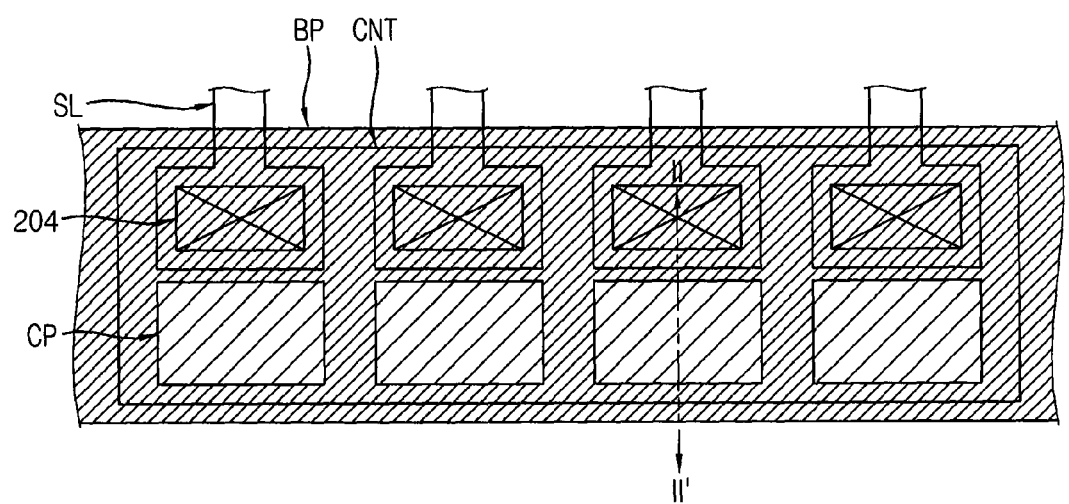
FIG. 3 is an enlarged plan view illustrating region 'B' of FIG. 1.
Figure 4:
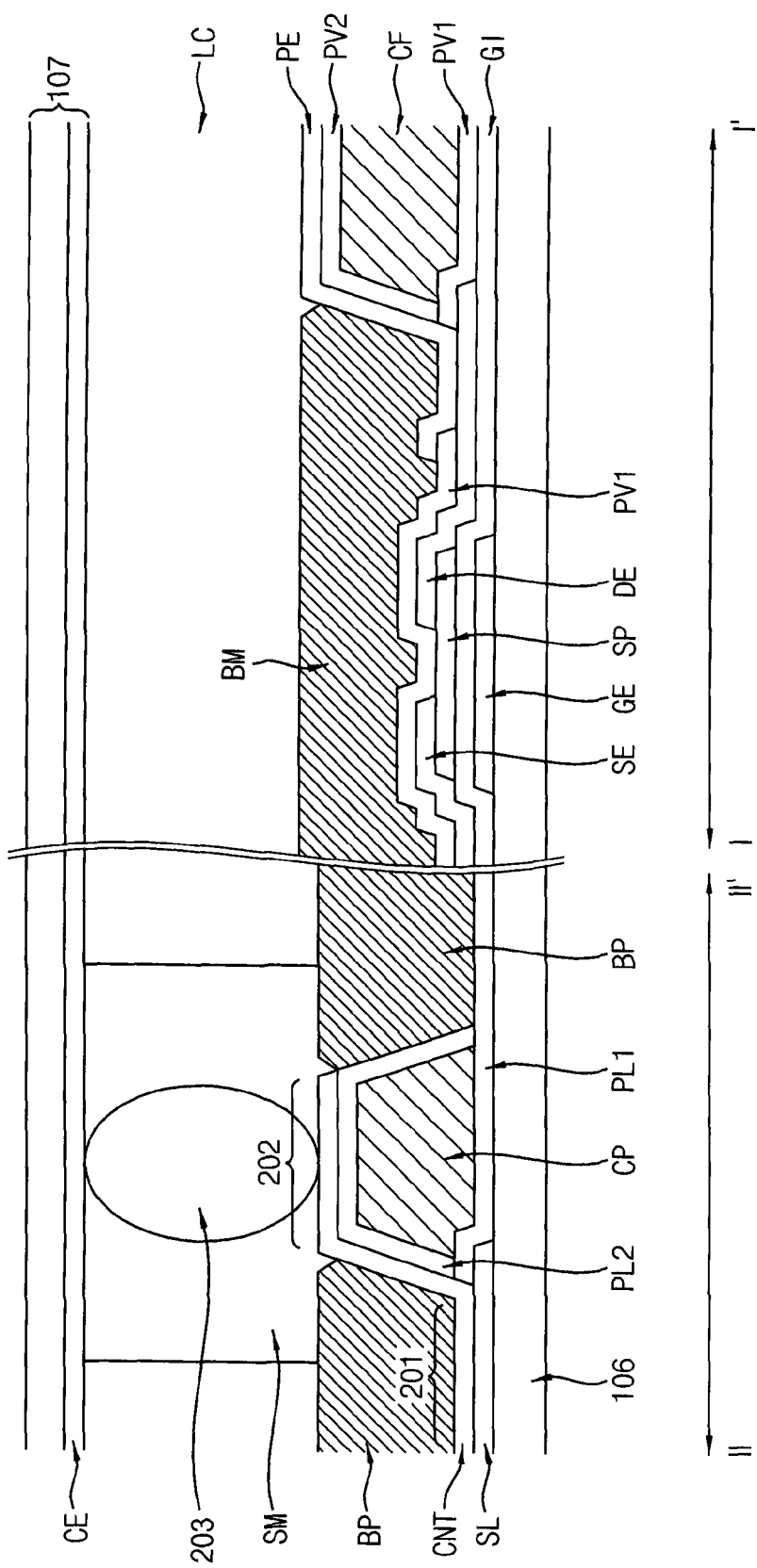
FIG. 4 is a cross-sectional view taken along the lines II' and II-II' of FIG. 2 and FIG. 3.
Figure 5:
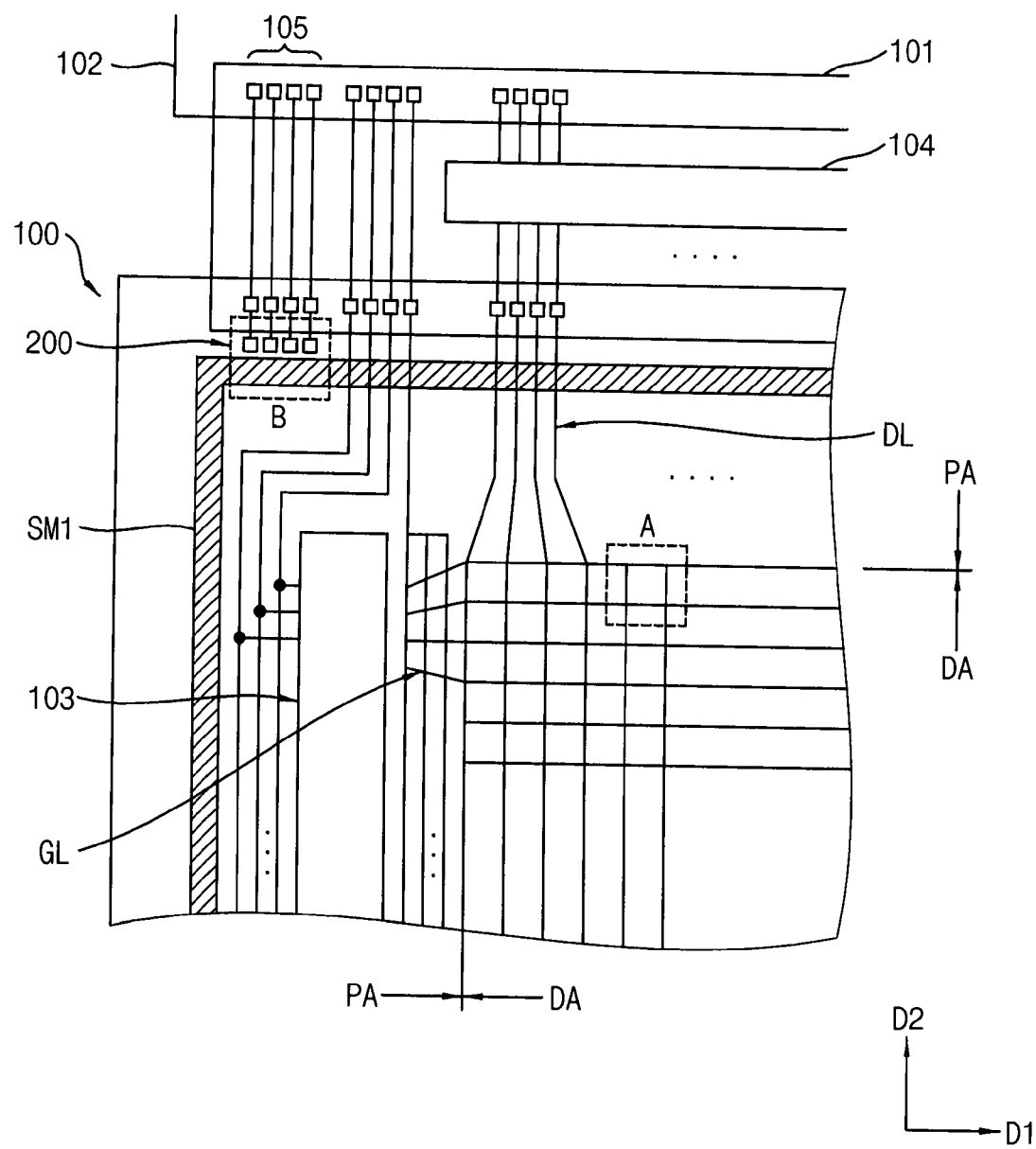
FIG. 5 is a plan view illustrating a display substrate according to an exemplary embodiment.
Figure 6:
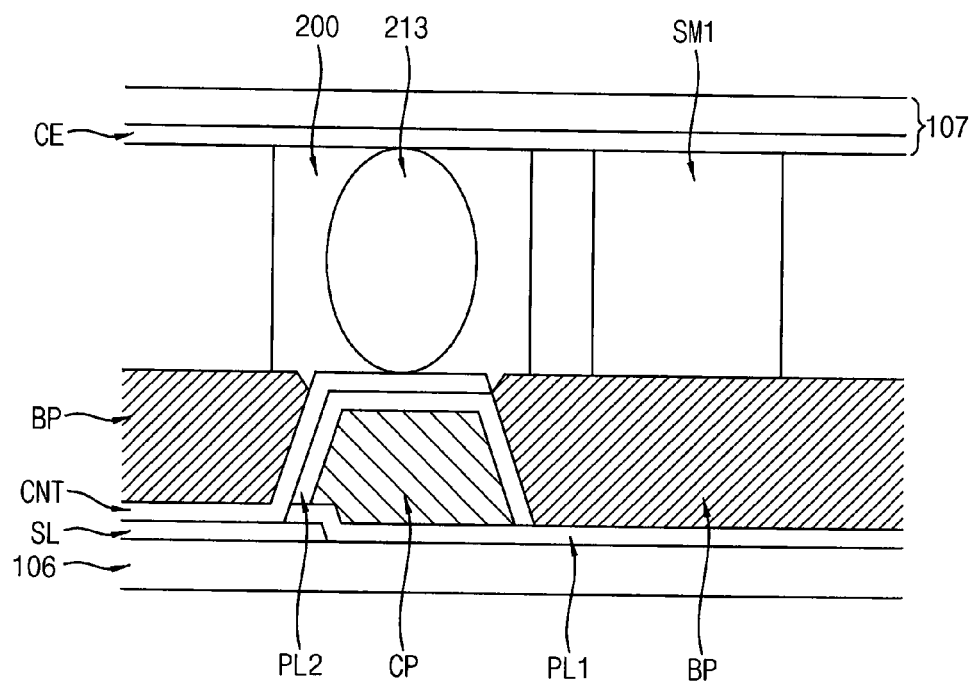
FIG. 6 is an enlarged cross-sectional view illustrating region 'B' of FIG. 5.

FIG. 2 is an enlarged plan view illustrating region 'A' of FIG. 1. FIG. 3 is an enlarged plan view illustrating region 'B' of FIG. 1. FIG. 4 is a cross-sectional view taken along the lines I-I' and II-II' of FIG. 2 and FIG. 3. FIG. 5 is a plan view illustrating a display substrate according to an exemplary embodiment. FIG. 6 is an enlarged cross-sectional view illustrating region 'B' of FIG. 5.

Referring to FIGS. 2 and 4, the display substrate 100 includes a display area DA and a peripheral area PA surrounding the display area DA. The display area DA transmits a light from a light source to display an image.

The display substrate 100 includes a base substrate 106. The base substrate 106 includes a transparent insulation substrate. Examples of a material that may be used for the base substrate 106 may include glass, plastic, polyethylene terephthalate resin, polyethylene resin, polycarbonate resin or the like.

A gate line GL, a gate insulation layer GI, a thin film transistor TFT, a data line DL, a first passivation layer PV1, a color filter CF, a second passivation layer PV2, a pixel electrode PE and a black matrix BM are disposed in the display area DA of the display substrate 100. The thin film transistor TFT includes a gate electrode GE, a semiconductor pattern SP, a source electrode SE and a drain electrode DE. In an embodiment, the thin film transistor TFT has a bottom-gate structure, however, the thin film transistors of the various embodiments are not limited thereto. For example, the thin film transistors may alternatively have a top-gate structure or a double-gate structure.

The gate line GL extends generally in a first direction D1 on a base substrate 106, and receives a gate on/off voltage from the gate driver 103. Examples of a material that may be used for the gate line GL may include aluminum, gold, silver, copper, iron, nickel, an alloy thereof or the like. The gate line GL may have a single-layered structure or a multiple-layered structure including different materials. The gate line GL may further include an oxide layer disposed on and/or under a metal layer. For example, the oxide layer may include indium zinc oxide, gallium zinc oxide or the like.

The gate electrode GE is electrically connected to the gate line GL. For example, the gate electrode GE may protrude from the gate line GL in a second direction D2 substantially perpendicular to the first direction D1. The gate electrode GE may be integrally formed with the gate line GL as a single unitary unit to include a same material as the gate line GL.

The gate insulation layer GI covers the gate line GL and the gate electrode GE, and is disposed on the base substrate 106. The gate insulation layer GI may include a transparent insulation material such as silicon oxide, silicon nitride or the like.

The data line DL is disposed on the gate insulation layer GI, and extends generally in the second direction D2. The data line DL receives a data voltage from the data driver 104. The data line DL may include substantially a same material as the gate line GL. Examples of a material that may be used for the data line DL may include aluminum, gold, silver, copper, iron, nickel, an alloy thereof or the like. The data line DL may have a single-layered structure or a multiple-layered structure including different materials.

The source electrode SE contacts the semiconductor pattern SP, and is electrically connected to the data line DL. The source electrode SE may protrude from the data line DL in the first direction D1. The source electrode SE may be integrally formed with the data line DL as a single unitary unit to include a same material as the data line DL.

The drain electrode DE is spaced apart from the source electrode SE, and contacts the semiconductor pattern SP. The drain electrode DE may include substantially a same material as the source electrode SE. Examples of a material that may be used for the drain electrode DE may include aluminum, gold, silver, copper, iron, nickel, an alloy thereof or the like.

The semiconductor pattern SP is disposed on the gate insulation layer GI, and overlaps the gate electrode GE. When a gate voltage is applied to the gate electrode GE, the semiconductor pattern SP is turned into a conductor to function as a channel electrically connecting the source electrode SE to the drain electrode DE. Examples of a material that may be used for the semiconductor pattern SP may include indium, zinc, gallium, tin, hafnium or the like. For example, the semiconductor pattern SP may include indium gallium zinc oxide (IGZO), hafnium indium zinc oxide (HIZO) or the like.

The first passivation layer PV1 covers the source electrode SE, the drain electrode DE and the semiconductor pattern SP. The first passivation layer PV1 includes a contact hole CH, through which the drain electrode DE is electrically connected to the pixel electrode PE. The first passivation layer PV1 may include substantially a same material as the gate insulation layer GI. For example, the first passivation layer PV1 may include silicon oxide, silicon nitride or the like.

The color filter CF overlaps the pixel electrode PE, and is disposed on the first passivation layer PV1. The color filter CF may include an organic material such as a photoresist material having a predetermined color such as red, green, blue, yellow, cyan, magenta or the like.

The second passivation layer PV2 is disposed on the color filter CF, and covers the color filter CF. The second passivation layer PV2 may include substantially a same material as the first passivation layer PV1. For example, the second passivation layer PV2 may include silicon oxide, silicon nitride or the like.

The pixel electrode PE is disposed on the second passivation layer PV2, and overlaps the color filter CF. A portion of the pixel electrode PE is connected to the drain electrode DE through the contact hole CH. The pixel electrode PE may overlap the first passivation layer PV1. The pixel electrode PE may include a plurality of slits (not shown). The pixel electrode PE may include a transparent conductive material. For example, the pixel electrode PE may include a metal oxide such as indium zinc oxide, indium tin oxide, tin oxide, zinc oxide or the like. The black matrix BM is disposed on the pixel electrode PE and/or the first passivation layer PV1. The black matrix BM may overlap the thin film transistor TFT. The black matrix BM may extend in the first direction D1 to cover the gate line GL, the gate electrode GE and the thin film transistor TFT. The black matrix BM may further cover a portion of the pixel electrode PE. Furthermore, the black matrix BM may extend in the second direction D2 to cover the data line DL. The black matrix BM may include a black material such as an inorganic black material, an organic black material or the like.

Referring to FIGS. 3 and 4, a signal line SL, a first protection layer PL1, a color pattern CP, a contact electrode CNT, a light-blocking pattern BP and a sealing member SM are disposed in the peripheral area PA. The contact electrode CNT includes a first portion overlapping the color pattern CT, and a second portion overlapping the light-blocking pattern BP.

The signal line SL is disposed on the base substrate 106, and is electrically connected to the common voltage providing line 105. The signal line SL may be formed from a same layer as the gate line GL or the data line DL. Thus, the signal line SL may be disposed in a same layer as the gate line GL or the data line DL. Thus, the signal line SL may include aluminum, gold, silver, copper, iron, nickel, an alloy thereof or the like. Furthermore, the signal line SL may further include an oxide layer disposed on and/or under a metal layer. For example, the oxide layer may include indium zinc oxide, gallium zinc oxide or the like.

The first protection layer PL1 covers the signal line SL, and includes an opening 204 overlapping an end of the signal line SL. The signal line SL contacts the contact electrode CNT through the opening 204. The protection layer PL1 may be formed from a same layer as the gate insulation layer GI or the first passivation layer PV1. Thus, the protection layer PL1 may be disposed in a same layer as the gate insulation layer GI or the first passivation layer PV1. Furthermore, the first protection layer PL1 may have a multiple-layered structure including a first layer formed from a same layer as the gate insulation layer GI, and a second layer formed from a same layer as the first passivation layer PV1. For example, the first protection layer PL1 may include silicon oxide, silicon nitride or the like.

The color pattern CP is disposed on the first protection layer PL1, and reflects or absorbs both light from below and external light reflected by the signal line SL. The light-blocking pattern BP may have a shape surrounding the color pattern CP in a plan view. For example, a plurality of color patterns CP are arranged along the first direction, and the light-blocking pattern BP may surround the plurality of color patterns CP. In another embodiment, the color pattern CP may have a shape surrounding the light-blocking pattern BP in a plan view. The contact electrode CNT may have a shape extending in the first direction and contacting the color patterns CP.

The color pattern CP may be formed from a same layer as the color filter CF. Thus, the color pattern CP may be disposed in a same layer as the color filter CF. The color pattern CP has a color, which depends on a color of the color filter CF. For example, the color pattern CP represents red, green, blue, yellow, cyan magenta or the like. The color pattern CP and the color filter CF may be formed from a photoresist composition including a coloring agent such as a pigment. Preferably, the color pattern CP is colored blue. A blue color pattern may have a relatively higher optical density or light-blocking ratio as compared to other colors.

The contact electrode CNT includes a first overlapping portion 201 not overlapping the color pattern CP. The first overlapping portion 201 contacts the signal line SL. The first overlapping portion 201 is disposed in the opening 204 of the first protection layer PL1. The contact electrode CNT further includes a second overlapping portion 202 contacting the sealing member SM. The second overlapping portion 202 extends from the first overlapping portion 201 to be disposed on the color pattern CP. For example, the second overlapping portion 202 may extend from the first overlapping portion 201 in the second direction D2. Thus, the second overlapping portion 202 overlaps the color pattern CP. The contact electrode CNT electrically connects the signal line SL to the common electrode CE. Thus, a common voltage is applied to the common electrode CE.

The contact electrode CNT may be formed from a same layer as the pixel electrode PE. Thus, the contact electrode CNT may be disposed in a same layer as the pixel electrode PE and may include a transparent conductive material. For example, the contact electrode CNT may include a metal oxide such as indium zinc oxide, indium tin oxide, tin oxide, zinc oxide or the like.

Referring to FIG. 4, a second protection layer PL2 is further disposed under the contact electrode CNT. The second protection layer PL2 may be disposed between the contact electrode CNT and the color pattern CP. Furthermore, the second protection layer PL2 may partially have a multiple-layered structure including the first protection layer PL1. The second protection layer PL2 may be formed from a same layer as the second passivation layer PV2. Thus, the second protection layer PL2 may be disposed in a same layer as the second passivation layer PV2.

The light-blocking pattern BP is disposed on the contact electrode CNT, and may overlap the first overlapping portion 201. The light-blocking pattern BP may be further disposed on the first protection layer PL1. The light-blocking pattern BP reflects or absorbs both light from below and external light reflected by the signal line SL. The light-blocking pattern BP may be formed from a same layer as the black matrix BM. Thus, the light-blocking pattern BP may be disposed in a same layer as the black matrix BM. The light-blocking pattern BP may include a same material as the black matrix BM, for example, an inorganic black material, an organic black material or the like.

The sealing member SM attaches the display substrate 100 to the opposing substrate 107. That is, the sealing member SM is attached to both the display substrate 100 and the opposing substrate 107. The sealing member SM includes a conductive material to electrically connect the contact electrode CNT to the common electrode CE through the second overlapping portion 202. For example, the conductive material may be a conductive spacer 203 having a ball or ovoid shape as shown. The conductive spacer 203 may include a conductor such as gold, copper, silver, nickel or the like. The conductive spacer 203 contacts both the contact electrode CNT and the common electrode CE, so that the contact electrode CNT is electrically connected to the common electrode CE.

In an embodiment, the sealing member SM includes a conductive material to electrically connect the contact electrode CNT to the common electrode CE. In another embodiment, the display substrate 100 has a conductive connection member separated from the sealing member. For example, referring to FIGS. 5 and 6, a sealing member SM1 includes an insulation material. A display substrate 100 further includes a conductive connection member 200 to electrically connect the contact electrode CNT to the common electrode CE. The conductive connection member 200 may be disposed outside the sealing member SM1, for example, in a peripheral area surrounding the sealing member SM1. In another embodiment, the conductive connection member 200 may be disposed inside the sealing member SM1. That is, the relative positions of the members 200, SM1 shown in FIG. 6 may be reversed. The conductive connection member 200 includes a conductive material such as a metal. For example, the conductive material may be a conductive spacer 213 having a ball or ovoid shape. The conductive spacer 213 may include gold, copper, silver, nickel or the like. The conductive spacer 213 contacts both the contact electrode CNT and the common electrode CE so that the contact electrode CNT is electrically connected to the common electrode CE.

The light-blocking pattern BP may be adjacent to the color pattern CP such that the light-blocking pattern BP and the color pattern CP are continuously arranged in plan view. That is, the patterns BP, CP may at least partially overlap each other in plan view. As a result, a height difference of the region of overlap, as compared to other neighboring areas, may be reduced in an area where the sealing member SM is disposed. When such a height difference is relatively large in the area where the sealing member SM is disposed, connection failure of the conductive spacer 213 may be caused. Furthermore, the height difference causes bending of an upper substrate so that light-leakage is perceived in an area adjacent to the sealing member SM.

According to exemplary embodiments, a height difference may be reduced in the area where the sealing member SM contacts the lower substrate 100. That is, the area underneath the sealing member SM may be made more planar, or flatter. Thus, connection reliability between the common electrode CE and the contact electrode CNT may be increased, and display quality in a peripheral area of a display device may be improved.

Figure 7:
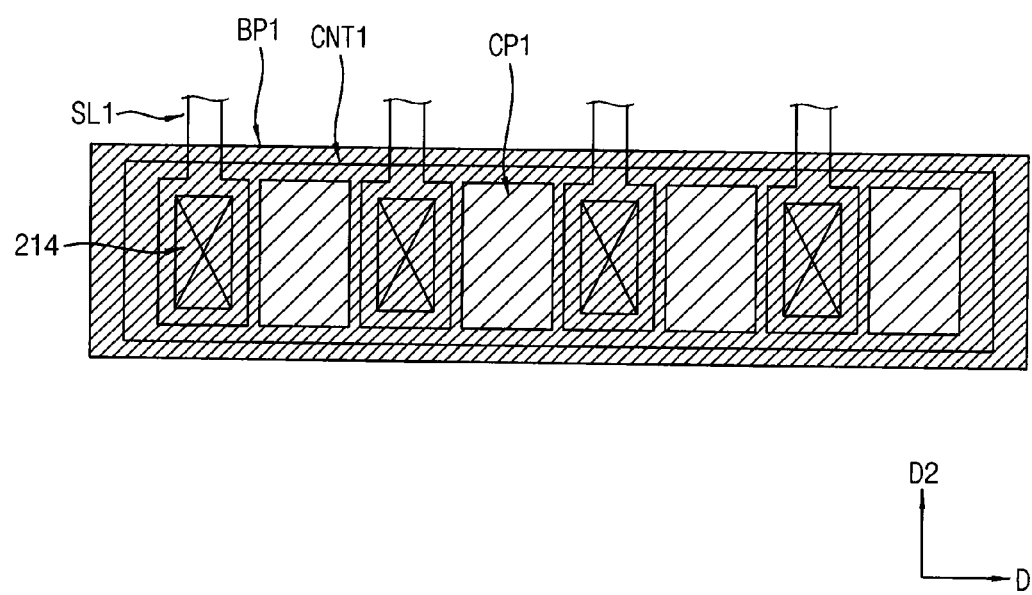
FIGS. 7, 8 and 9 are enlarged plan views illustrating a peripheral area of a display substrate according to another exemplary embodiment.
Figure 8:
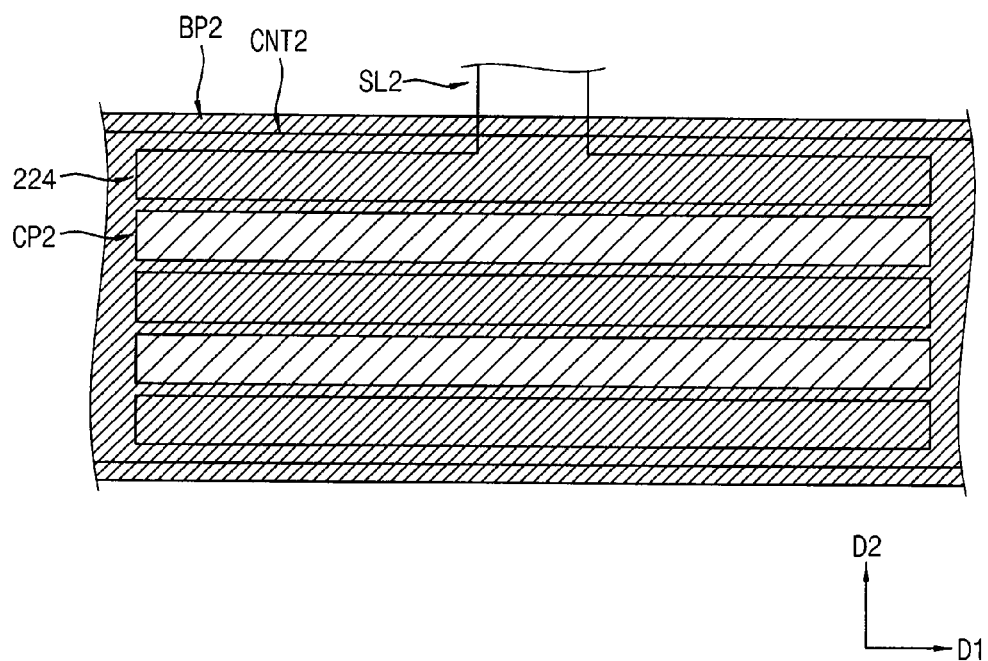
Figure 9:
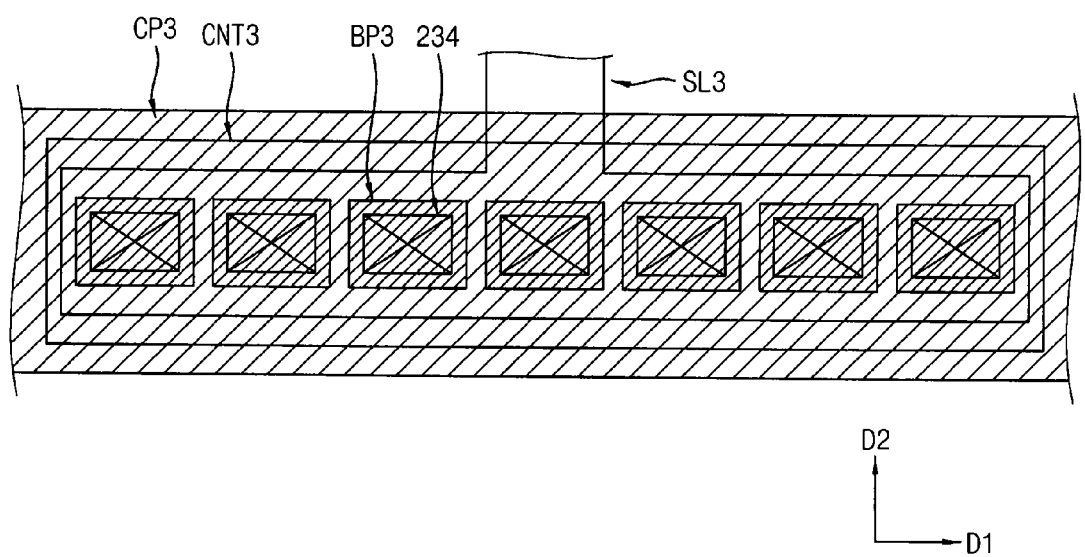

FIGS. 7 to 9 are enlarged plan views illustrating a peripheral area of a display substrate according to another exemplary embodiment.

Referring to FIG. 7, a signal line SL1, a color pattern CP1, a contact electrode CNT1, a light-blocking pattern BP1 and a protection layer including an opening 214 are disposed in a peripheral area of a display substrate. The signal line SL1, the color pattern CP1, the contact electrode CNT1, the light blocking pattern CP1 and the protection layer may be formed through substantially the same processes as the display substrate previously explained with reference to FIGS. 1 to 4. Thus, any duplicated explanation may be omitted. Referring to FIG. 7, the contact electrode CNT1 includes a first overlapping portion disposed in the opening 214, and a second overlapping portion disposed on the color pattern CP1. The color pattern CP1 and the opening 214 may be alternately arranged along a single direction. For example, the color pattern CP1 and the opening 214 may be alternately arranged in a first direction D1 substantially parallel to a gate line. The light-blocking pattern BP1 may have a shape surrounding the color pattern CP1.

Referring to FIG. 8, a signal line SL2, a color pattern CP2, a contact electrode CNT2, a light-blocking pattern BP2 and a protection layer including an opening 224 are disposed in a peripheral area of a display substrate. The contact electrode CNT2 includes a first overlapping portion disposed in the opening 224, and a second overlapping portion disposed on the color pattern CP2. The color pattern CP2 and the opening 224 may have a major axis extending in one direction. For example, the color pattern CP2 and the opening 224 may have a major axis extending in a first direction D1 substantially parallel to a gate line. Furthermore, multiple ones of the color pattern CP2 and the opening 224 may be alternately arranged in a second direction D2 substantially parallel to a data line. The light-blocking pattern BP2 may have a shape surrounding the color pattern CP2.

Referring to FIG. 9, a signal line SL3, a color pattern CP3, a contact electrode CNT3, a light-blocking pattern BP3 and a protection layer including an opening 234 are disposed in a peripheral area of a display substrate. The contact electrode CNT3 includes a first overlapping portion disposed in the opening 324, and a second overlapping portion disposed on the color pattern CP3. The light-blocking pattern BP3 may overlap the opening 234. A plurality of light-blocking patterns BP3 and a plurality of openings 234 are arranged along one direction. For example, the light-blocking patterns BP3 and the openings 234 may be arranged along a first direction substantially parallel to a gate line. The color pattern CP3 may have a shape surrounding the light-blocking patterns BP3 and the openings 234.

According to exemplary embodiments, connection failure of a conductive spacer, which may be caused by height difference in an area where a sealing member is disposed, may be improved. Furthermore, light leakage, which may be caused by a bent substrate in an area adjacent to the sealing member, may be prevented or reduced thereby improving display quality of a liquid crystal display device. Furthermore, a light from below and an external light reflected by a signal line may be reduced so that display quality in a peripheral area is improved.

The foregoing is illustrative and is not to be construed as limiting thereof. Although a few exemplary embodiments have been described, those skilled in the art will readily appreciate that many modifications are possible in the exemplary embodiments without materially departing from the novel teachings, aspects, and advantages of the invention. Accordingly, all such modifications are intended to be included within the scope of this disclosure.

What is claimed is:

1. A display substrate comprising:
   a thin film transistor array disposed in a display area;
   a signal line disposed in a peripheral area surrounding the display area;
   a contact electrode disposed on the signal line and contacting the signal line;
   a light-blocking pattern overlapping a first portion of the contact electrode; and
   a color pattern overlapping a second portion of the contact electrode.

2. The display substrate of claim 1, wherein the light-blocking pattern is disposed on the first portion of the contact electrode.

3. The display substrate of claim 1, wherein the second portion of the contact electrode is disposed on the color pattern.

4. The display substrate of claim 1, further comprising a protection layer disposed on the signal line and including an opening overlapping the contact electrode.

5. The display substrate of claim 4, wherein the opening overlaps the light-blocking pattern.

6. The display substrate of claim 1, wherein the light-blocking pattern substantially surrounds the color pattern in a plan view.

7. The display substrate of claim 1, wherein the color pattern substantially surrounds the light-blocking pattern in a plan view.

8. The display substrate of claim 1, wherein the color pattern and the first overlapping portion are arranged in alternating manner along a direction.

9. The display substrate of claim 1, wherein the color pattern and the first portion extend in a first direction, and the color pattern and the first overlapping portion are arranged in alternating manner along a second direction perpendicular to the first direction.

10. The display substrate of claim 1, wherein the color pattern has a blue color.

11. The display substrate of claim 1, wherein the light-blocking pattern has a black color.

12. A liquid crystal display device comprising:
 a display substrate including a thin film transistor array disposed in a display area;
 an opposing substrate including a common electrode facing the display substrate;
 a liquid crystal layer interposed between the display substrate and the opposing substrate; and
 a sealing member surrounding the liquid crystal layer and coupling the display substrate to the opposing substrate,
 wherein the display substrate further includes a signal line disposed in a peripheral area surrounding the display area, a contact electrode disposed on and contacting the signal line, a light-blocking pattern overlapping a first portion of the contact electrode, and a color pattern overlapping a second portion of the contact electrode.

13. The liquid crystal display device of claim 12, wherein the sealing member is disposed on the second portion of the contact electrode.

14. The liquid crystal display device of claim 12, wherein the sealing member electrically connects the contact electrode to the common electrode.

15. The liquid crystal display device of claim 14, wherein the sealing member includes a conductive spacer.

16. The liquid crystal display device of claim 13, wherein the sealing member includes an insulating material, and
 the liquid crystal display device further includes a conductive connection member separated from the sealing member and electrically connecting the contact electrode to the common electrode.

17. The liquid crystal display device of claim 12, wherein the thin film transistor array includes:
 a gate line;
 a data line crossing the gate line;
 a thin film transistor electrically connected to the gate line and the data line;
 a pixel electrode electrically connected to the thin film transistor;
 a color filter overlapping the pixel electrode; and
 a black matrix overlapping with the thin film transistor.

18. The liquid crystal display device of claim 17, wherein the signal line is formed from a same layer as the gate line or the data line.

19. The liquid crystal display device of claim 17, wherein the color pattern is formed from a same layer as the color filter.

20. The liquid crystal display device of claim 17, wherein the light-blocking pattern is formed from a same layer as the black matrix.

* * * * *